United States Patent
Ghosh et al.

(10) Patent No.: US 10,503,862 B1
(45) Date of Patent: Dec. 10, 2019

(54) ELECTRONIC CIRCUIT DESIGN EDITOR WITH OFF-SCREEN VIOLATION DISPLAY AND CORRECTION

(71) Applicant: CADENCE DESIGN SYSTEMS, INC., San Jose, CA (US)

(72) Inventors: Sanjib Ghosh, Noida (IN); Anup Kumar Lohiya, Bhiwani (IN); Preeti Kapoor, New Delhi (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 152 days.

(21) Appl. No.: 15/714,044

(22) Filed: Sep. 25, 2017

(51) Int. Cl.
*G06F 17/50* (2006.01)
*G06F 16/23* (2019.01)
*G06F 3/0486* (2013.01)

(52) U.S. Cl.
CPC .......... *G06F 17/5081* (2013.01); *G06F 16/23* (2019.01); *G06F 17/5022* (2013.01); *G06F 17/5072* (2013.01); *G06F 17/5077* (2013.01); *G06F 3/0486* (2013.01); *G06F 17/5045* (2013.01); *G06F 17/5068* (2013.01)

(58) Field of Classification Search
CPC ............. G06F 17/5045; G06F 17/5068; G06F 17/5081; G06F 17/24; G06F 17/5009; G06F 8/34; G06F 17/50; G06F 3/04842; G06F 3/0486
See application file for complete search history.

(56) References Cited

U.S. PATENT DOCUMENTS

| | | | | |
|---|---|---|---|---|
| 5,258,919 A * | 11/1993 | Yamanouchi | ....... | H01L 27/0207 716/103 |
| 5,416,722 A * | 5/1995 | Edwards | ............. | G06F 17/5081 716/52 |
| 5,914,889 A * | 6/1999 | Cohen | ...................... | G02B 6/12 716/52 |
| 6,516,456 B1 * | 2/2003 | Garnett | ............... | G06F 17/5022 716/119 |
| 6,654,946 B1 * | 11/2003 | Eneboe | ............... | G06F 17/5045 716/104 |
| 7,328,420 B1 * | 2/2008 | Datta | .................. | G06F 17/5054 716/102 |
| 7,367,006 B1 * | 4/2008 | O'Riordan | .......... | G06F 17/5045 716/102 |

(Continued)

OTHER PUBLICATIONS

Lee et al., "TED: A Graphical Technology Description Editor"; 1987; 24th ACM/IEEE Design Automation Conference; pp. 423-428 (Year: 1987).*

*Primary Examiner* — Helen Rossoshek
(74) *Attorney, Agent, or Firm* — Tarolli, Sundheim, Covell & Tummino LLP

(57) ABSTRACT

A circuit editor generates a graphic rendering of an electronic circuit design for partial display in a visual canvas on a display unit. The circuit editor detects aberrant arrangements of circuit elements which violate predetermined circuit layout criteria, such as minimum spacing between the edges or corners of circuit elements, and forms a correction scheme to rearrange the circuit elements such that consistency with the circuit layout criteria is restored. When the aberrant arrangements are not themselves displayed in the visual canvas, the circuit editor generates visual indications of the layout violation and of the correction scheme, the latter being used to guide user correction of the violation.

20 Claims, 10 Drawing Sheets

(56) References Cited

U.S. PATENT DOCUMENTS

| | | | |
|---|---|---|---|
| 7,478,352 B2 * | 1/2009 | Chaplin | G06F 17/5095 703/1 |
| 7,735,036 B2 * | 6/2010 | Dennison | G06F 17/5045 716/106 |
| 8,046,730 B1 * | 10/2011 | Ferguson | G06F 17/5068 716/100 |
| 8,074,189 B2 * | 12/2011 | McConaghy | G06F 17/5036 700/103 |
| 8,271,909 B2 * | 9/2012 | Majumder | G06F 17/5081 716/104 |
| 8,327,315 B1 * | 12/2012 | Ghosh | G06F 17/5081 716/102 |
| 8,427,502 B2 * | 4/2013 | Choudhary | G06F 17/5045 345/619 |
| 8,560,109 B1 * | 10/2013 | Parr | G05B 15/00 345/420 |
| 8,612,923 B2 * | 12/2013 | Arora | G06F 17/5068 715/243 |
| 8,640,078 B2 * | 1/2014 | Majumder | G06F 3/048 716/139 |
| 8,650,529 B2 * | 2/2014 | Bosshart | G06F 17/5077 716/110 |
| 8,689,121 B2 * | 4/2014 | O'Riordan | G06F 9/451 715/763 |
| 8,782,577 B2 * | 7/2014 | Fischer | G06F 17/5068 716/100 |
| 9,043,741 B2 * | 5/2015 | Batterywala | G06F 17/5081 716/110 |
| 9,122,384 B1 * | 9/2015 | Kohli | G09G 5/02 |
| 9,182,948 B1 * | 11/2015 | O'Riordan | G05B 19/0426 |
| 10,178,080 B1 * | 1/2019 | Khanna | H04L 63/08 |
| 10,210,299 B1 * | 2/2019 | Ginetti | G06F 17/5072 |
| 10,223,495 B1 * | 3/2019 | Agrawal | G06F 17/5081 |
| 2004/0019862 A1 * | 1/2004 | Li | G06F 17/5068 716/112 |
| 2005/0251757 A1 * | 11/2005 | Fam | G06F 8/34 715/810 |
| 2007/0260432 A1 * | 11/2007 | Okada | G06F 17/5004 703/1 |
| 2010/0037136 A1 * | 2/2010 | Choudhary | G06F 17/5045 715/708 |
| 2010/0199235 A1 * | 8/2010 | El Yahyaoui | G06F 17/5081 716/122 |
| 2010/0205576 A1 * | 8/2010 | Majumder | G06F 17/5081 716/122 |
| 2012/0227023 A1 * | 9/2012 | Bendicksen | G06F 17/5081 716/112 |
| 2013/0246900 A1 * | 9/2013 | Ginetti | G06F 17/5068 715/229 |
| 2018/0150587 A1 * | 5/2018 | Tskitishvili | G06F 17/5072 |
| 2018/0329589 A1 * | 11/2018 | Sonnino | G06F 3/0483 |

* cited by examiner

ELECTRONIC CIRCUIT DESIGN EDITOR WITH OFF-SCREEN VIOLATION DISPLAY AND CORRECTION

BACKGROUND OF THE INVENTION

The subject system and method are generally directed to viewing and editing electronic circuit designs on circuit design editors. The system and method generally provide for the indication of violations of layout criteria in an electronic circuit design even when violations occur in an undisplayed, "off-screen" portion of the design, and for suitable guidance to lead a designer to correct the layout.

Modern electronic circuits and circuit boards are immensely complex, and the design thereof equally so. Robust circuit design editors have therefore become increasingly important to the design process. Such editors allow a circuit designer or design team to arrange and rearrange various circuit components or elements and the interconnections therebetween, for later manufacture of the resulting circuit design. These editors typically provide visual interfaces, to allow the designer to see the arrangement of circuit elements. Additional benefits in many editors include automated measures for monitoring the design to confirm that its elements suitably comply with predetermined criteria such as, for example, signal timing between starting and ending points of a signal path, minimum and maximum voltage within elements, and minimum spacing between elements.

SUMMARY OF THE INVENTION

While not limited thereto, an exemplary embodiment of the invention is directed to a system for viewing and editing an electronic circuit design. The circuit design has a plurality of circuit elements positioned and interconnected according to a predetermined set of circuit layout criteria. The system includes a circuit editor executed on a processor to generate a graphic rendering of the electronic circuit design responsive to user input through a user interface. The circuit editor includes a violation detection portion executing to detect a layout violation indicating aberrant arrangement of one or more circuit elements relative to the other circuit elements in a manner inconsistent with the circuit layout criteria, and a violation correction portion executing to resolve a layout violation, the violation correction portion forming a rearrangement scheme for at least one circuit element to restore consistency with the circuit layout criteria. The system further includes a display unit coupled to the circuit editor. The display unit defines a visual canvas to display the graphic rendering for a first portion of the electronic circuit design, a second portion of the electronic circuit design remaining undisplayed outside the visual canvas. The circuit editor generates on the visual canvas, for each layout violation having an aberrant arrangement of circuit elements occurring outside the visual canvas, both a first visual indication of the layout violation and a second visual indication of the rearrangement scheme for guiding user correction of the layout violation.

While not limited thereto, another exemplary embodiment of the invention is directed to a system for viewing and editing an electronic circuit design in accordance with predetermined circuit layout criteria. The system includes a circuit editor executed on a processor to generate and edit a spatially arranged plurality of circuit elements in an electronic circuit design responsive to user input through a user interface. The circuit editor includes a violation detection portion executing to detect an arrangement of circuit elements in violation of predetermined circuit layout criteria. The system further includes a display unit coupled to the circuit editor. The display unit displays a graphic rendering of an on-screen portion of the electronic circuit design, an off-screen portion of the electronic circuit design remaining undisplayed. When an arrangement of circuit elements determined to violate the circuit layout criteria includes at least one circuit element arranged in the off-screen portion of the electronic circuit design, the circuit editor generates for the graphic rendering both a first visual indication of the violation and a second visual indication of a rearrangement scheme for at least one circuit element to thereby guide user correction of the layout violation.

While not limited thereto, another exemplary embodiment of the invention is directed to a method of viewing and editing an electronic circuit design. The circuit design has a plurality of circuit elements positioned and interconnected according to a predetermined set of circuit layout criteria. The method includes defining a visual canvas on a display unit, executing a processor to generate a graphic rendering of the electronic circuit design responsive to user input through a user interface, displaying the graphic rendering for a first portion of the electronic circuit design within the visual canvas of the display unit, a second portion of the electronic circuit design remaining undisplayed outside the visual canvas, executing a processor to detect a layout violation indicating aberrant arrangement of one or more circuit elements relative to the other circuit elements in a manner inconsistent with the circuit layout criteria, executing a processor to form a rearrangement scheme for at least one circuit element to restore consistency with the circuit layout criteria, and executing a processor to generate on the visual canvas for each layout violation having an aberrant arrangement of circuit elements occurring outside the visual canvas both a first visual indication of the layout violation and a second visual indication of the rearrangement scheme for guiding user correction of the layout violation.

Additional aspects, details, and advantages of the disclosed system and method will be set forth, in part, in the description and figures which follow.

DETAILED DESCRIPTION OF THE PREFERRED EMBODIMENTS

Figure 1A:
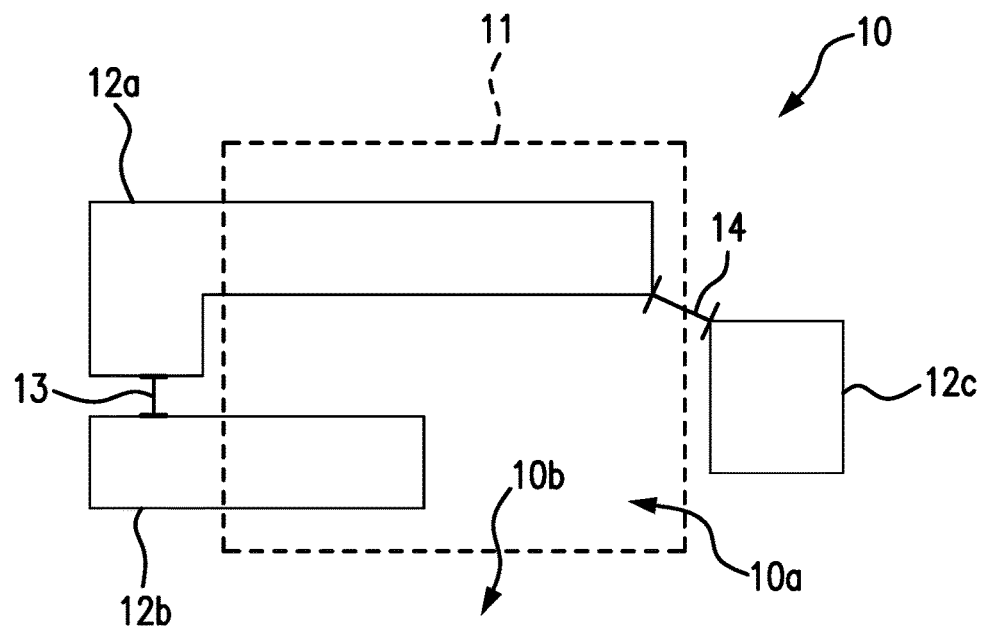
FIG. 1A is a depiction of an example circuit design.

Reference will now be made in detail to exemplary embodiments, which are illustrated in the accompanying drawings, wherein like reference numerals refer to the like elements throughout. The embodiments are described below in order to explain the disclosed system and method by referring to the figures.

While exemplary embodiments will be described primarily in the context of computer assisted electronic circuit design, it will be appreciated by those of skill in the art that the principles described herein are applicable in other contexts.

Briefly, the subject system and method provide for viewing and editing of an electronic circuit design and of configurations of the circuit elements thereof. More specifically, the system and method provide for detection of inconsistencies with a predetermined set of circuit layout criteria in the electronic circuit design; such inconsistencies typically leading to violations of these criteria. At various magnified or partial views of the electronic circuit design, some or all of the circuit elements which violate the criteria may not be within the viewed portion of the design. The system and method therefore also provide for rendering and display of indications of these violations, as well as of schemes for correcting them. These indications are preferably provided in a visible and readily comprehensible manner to a user even when the circuit elements violating the criteria are neither visible nor visibly referenced.

In an exemplary embodiment and illustrative application, a circuit editor is established. The circuit editor or related software generates a graphic rendering of the electronic circuit design, which is in turn displayed on a visual "canvas" defined on a suitable display mechanism such as a monitor. This canvas is frequently coupled to a user interface which allows the circuit designer to manipulate the design by adding, removing, relocating, or changing the parameters of circuit elements and the interconnections therebetween. A wide variety of circuit elements are known in the art, just a few exemplary types of which include power sources, capacitors, sinks, and switches. The design itself may be thought of as a spatial arrangement of circuit elements and interconnections, which are usually but not necessarily represented in a two-dimensional view, and each element having various configuring parameters such as element type, dimensions, interconnection points, voltage, capacitance, frequency, and so forth as appropriate.

Figure 1B:
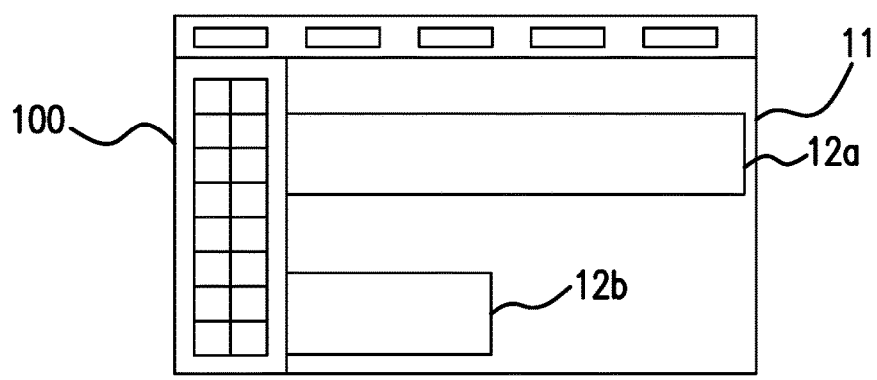
FIG. 1B is a depiction of an on-screen portion of the design of FIG. 1A as rendered in an illustrative circuit editor user interface, in accordance with an exemplary embodiment of the present invention.

FIG. 1A depicts a simple example circuit design. FIG. 1B depicts an on-screen portion of this design as rendered in an illustrative circuit editor user interface, according to an embodiment of the invention.

As previously noted, a circuit design 10 can contain vast numbers of circuit elements, many of them tiny compared to the overall design. When viewing the entire design at once on even the largest display monitors or other display units, some elements will inevitably be too small to view or manipulate in a useful manner. Therefore, the majority of design work is conducted with a visual canvas 11 on the display unit magnified or "zoomed in," to display only a smaller portion of a design at a larger magnification. This smaller, magnified portion constitutes an "on-screen" portion 10a of the design, with the undisplayed remainder being an "off-screen" portion 10b.

A circuit editor typically includes circuit layout criteria and other circuit criteria, which is typically predetermined. Arrangements of circuit elements can violate circuit layout criteria when, for instance, placed less than a minimum distance from each other; that is, when one of an element's edges is too close to a neighboring edge of another circuit element. This minimum distance requirement is preferably predetermined, and typically varies depending on the circuit elements involved (e.g. a high-voltage element requiring neighboring elements to be spaced a considerable distance therefrom, in comparison to another element requiring a comparatively small spacing). Other types of criteria are violated, for example, when neighboring corners of two circuit elements are positioned too close together, or when a power source of certain voltage is connected to a circuit element incompatible with such voltage. Still other layout criteria, both distance-based and otherwise, will be known or conceivable to those of skill in the art.

Arrangements and configurations of circuit elements that are inconsistent with the given circuit layout criteria may be termed aberrant, and are considered to produce a "layout violation" or "criteria violation." Ideally, upon being alerted to a violation, a designer responds with corrective action by, for instance, rearranging or reconfiguring the circuit elements, before the design is finalized for further processing in the overall design flow.

However, when the entire design is not visible, the location where one element has breached the minimum distance of another, or otherwise become inconsistent with the circuit layout criteria, may not be visible or apparent. This tends to hinder corrective action as the designer may not be able to determine the cause, location, or even existence of the violation.

In the illustrative example shown in FIG. 1A, circuit element 12a has encroached on the minimum edge-to-edge distance of circuit element 12b at location 13, as well as the minimum corner-to-corner distance of circuit element 12c at location 14. However, the canvas 11 is "zoomed in" to contain less than the entire design 10, and location 13 is not within the on-screen portion 10a; that is, not within the canvas 11. Furthermore, circuit element 12c remains completely outside the canvas 11.

The example user interface 100 of FIG. 1B incorporates the canvas 11 which displays the on-screen portion 10a, but not the off-screen portion 10b. A designer therefore is unable to see that circuit element 12a has breached encroached on the minimum edge-to-edge distance of circuit element 12b, or that circuit element 12c is present at all.

Figure 2A:
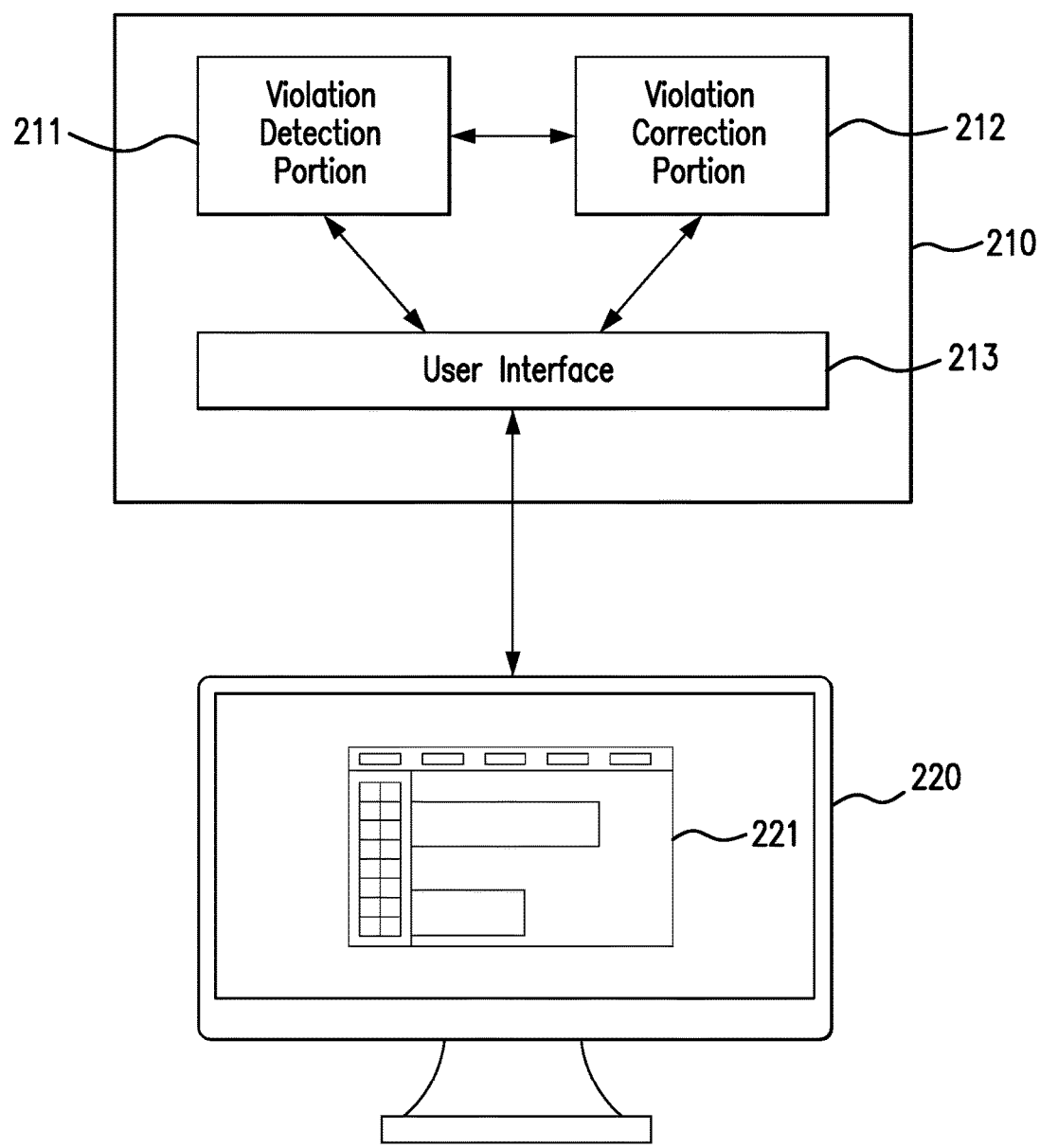
FIG. 2A is a block diagram illustrating a system for viewing and editing an electronic circuit design, in accordance with an exemplary embodiment of the present invention.

FIG. 2A depicts a system for viewing and editing an electronic circuit design, according to an embodiment of the invention. In the depicted system, a circuit editor 210 is coupled to a display unit 220.

Generally, the circuit editor 210 generates a graphic rendering of an electronic circuit design, which is presented within a visual canvas 221 on the display unit 220. The circuit editor 210 preferably includes software instructions stored on non-transitory computer readable media and executed on a computer processor.

The circuit editor 210 preferably includes a violation detection portion 211, which executes to detect violations of the predetermined circuit layout criteria, and in certain embodiments other circuit criteria. That is, the violation detection portion 211, in various embodiments, monitors the arrangement and/or the parameters of the circuit elements to detect when elements are inconsistent with applicable criteria. Measures for detection will vary depending on the specific criteria and specific format of the circuit design's representation, but are generally known in the art and will not be elaborated on further.

The violation detection portion 211 preferably also executes to generate violation indicators of the layout violation for the benefit of the designer. In alternate embodiments, these indicators are suitably generated by another portion of the circuit editor 210 or of the system as a whole.

Preferably, these indicators are implemented as visual indications rendered with the graphic rendering of the electronic circuit design itself, providing information such as the nature of the violation and the circuit elements involved. Various examples of violation indicators are provided further herein.

The circuit editor 210 preferably includes a violation correction portion 212, which executes to form at least one rearrangement scheme or other corrective scheme to remedy one or more detected violations. Suitably executing the rearrangement scheme restores consistency with the circuit layout criteria, thus correcting the detected violations. For violations related to the arrangement of circuit elements relative to each other, a responsive rearrangement scheme preferably includes moving one or more of the circuit elements (for example, to the minimum permissible distance from the other circuit elements), although in alternate embodiments it includes changing the size of one or more of the circuit elements. For violations related to internal parameters of one or more of the circuit elements, a responsive corrective scheme preferably includes changing the parameters to permissible values.

Although certain embodiments permit the violation correction portion 212, or another portion of the circuit editor 210 or system, to execute the corrective scheme automatically, it is preferable in alternate embodiments and applications for the designer to see the corrective scheme and approve it before execution thereof. Therefore, the violation correction portion 212 preferably also executes to generate rearrangement indicators or other corrective indicators for the benefit of the designer, which guide user correction of the violation. In alternate embodiments, these indicators are generated by another portion of the circuit editor 210 or of the system as a whole.

The designer is able to directly perform the correction with the guidance of the corrective indicators. In certain embodiments, the designer optionally actuates the system to execute the corrective scheme automatically, through a keystroke or keystroke combination, or other user input methods known in the art. In certain embodiments, the designer optionally configures a setting such that the system consistently executes the corrective scheme automatically without further actuation; in certain embodiments, the corrective indicators are generated while this setting is active, while in alternate embodiments they are not.

Preferably, these indicators are visual indications suitably rendered with the graphic rendering of the electronic circuit design itself, providing information such as the nature of the violation and the circuit elements involved. Illustrative examples of corrective indicators will be provided further herein.

The circuit editor 210 preferably includes a user interface 213, which responds to user input to manipulate the design and the circuit elements and interconnections therein. Preferably, the graphic rendering generated by the circuit editor 210 is modified responsive to this input. As noted previously, FIG. 1B depicts but one of numerous examples of a user interface, specifically a graphical user interface directly incorporating the visual canvas 221. Those of skill in the art will be able to conceive of numerous suitable interfaces, which therefore will not be described herein. To the extent that specific features of a user interface are relevant to an embodiment of the invention, they will be described below as their relevance is made clear.

The display unit 220 displays the visual canvas 221 containing the graphic rendering of the electronic circuit design, or an on-screen portion thereof. In various embodiments, the display unit 220 preferably also displays graphical elements of the user interface 213. For convenience of depiction, the display unit 220 is depicted as a computer monitor in FIG. 2A. However, the term "display unit" as used herein refers generally to suitable devices known in the art to be capable of visual presentation, including but not limited to a computer monitor, laptop screen, tablet screen, handheld screen, panel screen, smart phone, smart watch, television, projector, electronic paper, head-mounted display, holographic display or other three-dimensional projector, or virtual reality/augmented reality system.

Figure 2B:
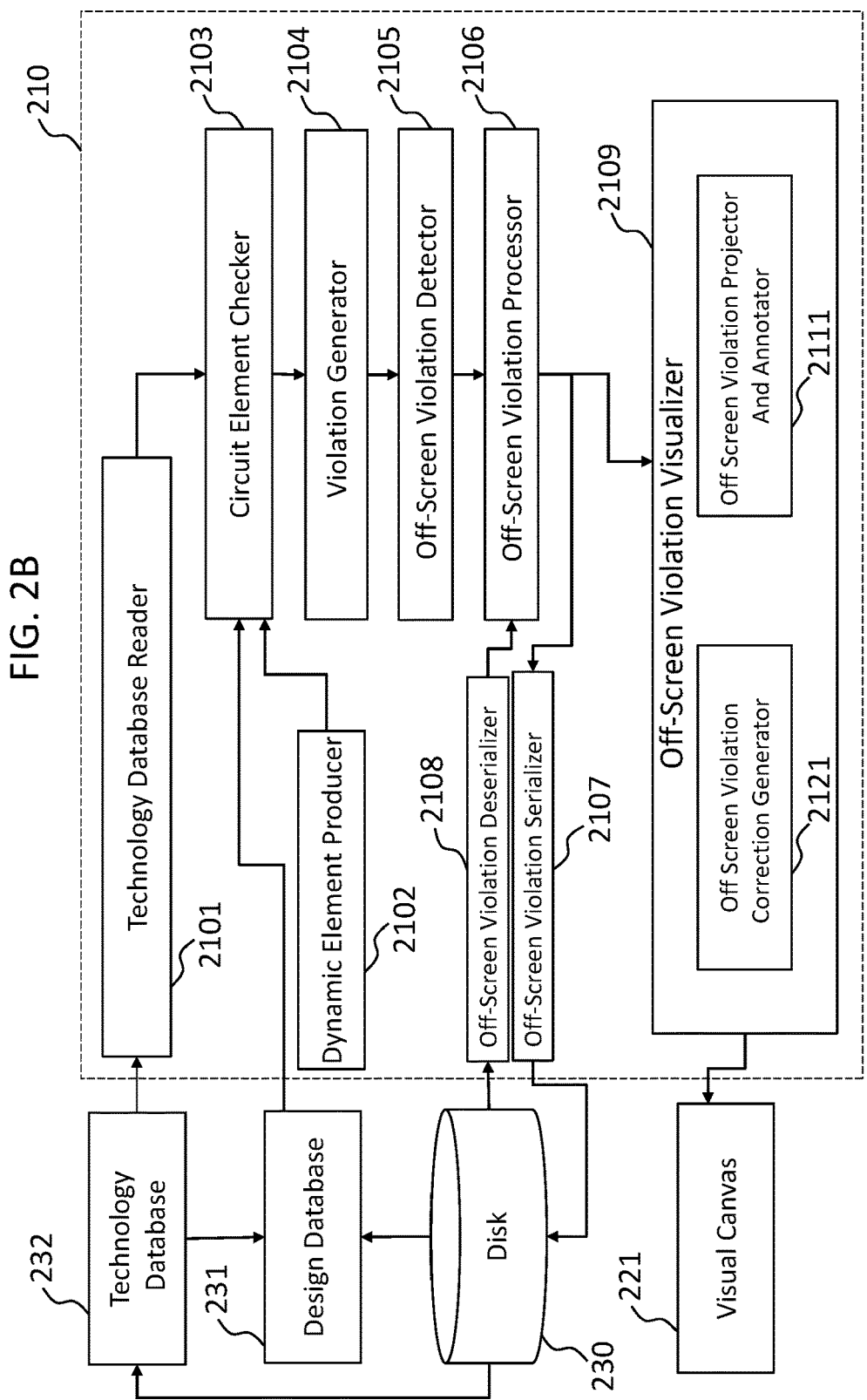
FIG. 2B is a data flow diagram illustrating the flow of data in a system for viewing and editing an electronic circuit design, in accordance with an exemplary embodiment of the present invention.

FIG. 2B details certain components of a system for viewing and editing an electronic circuit design, and the flow of data therebetween, according to an exemplary embodiment of the invention. As in FIG. 2A, a circuit editor 210 and visual (layout) canvas 221 are depicted. Additionally, the system includes a disk 230 or other storage media. The disk 230 contains, or otherwise interacts with, design database 231 and technology database 232. Design database 231 stores the electronic circuit design and information on the circuit elements which are included therein. Technology database 232 stores the predetermined layout criteria, and other data related to how the circuit elements will operate and interact when manufactured. The design database 231 preferably retrieves information from the technology database 232 to store into the design.

A technology database reader 2101 of the circuit editor 210 preferably executes as needed to access the technology database 232 to read the circuit layout criteria. Relevant criteria are then provided to a circuit element checker 2103, which also retrieves the electronic circuit design from the design database 231, and in certain embodiments also retrieves data on circuit elements just added to the design from the dynamic element producer 2102. The circuit element checker 2103 accumulates this information for each circuit element.

The violation generator 2104 detects violation conditions of the circuit layout criteria in the accumulated information for the circuit elements, generating a violation in such cases.

Violations are then reviewed by an off-screen violation detector 2105 to determine if they are outside the visual canvas 221 according to the graphic rendering. If so, an off-screen violation processor 2106 actuates certain processes which are specialized for off-screen violations.

In certain embodiments, the off-screen violation processor 2106 needs to store some or all of the data on the violations between moments of processing. It therefore provides this data to an off-screen violations serializer 2107, which converts the data into a format convenient for storage to the disk 230. The stored data is then read back and deserialized by an off-screen violations deserializer 2108.

The off-screen violation processor 2106 also passes each violation to an off-screen violation visualizer 2109. The off-screen violation visualizer 2109 generates visual indications related to the violation which will be displayed in the visual canvas 221, notwithstanding that the violation itself is not completely displayed within the visual canvas 221. This visualizer 2109 preferably includes an off-screen violation projector and annotator 2111, which generates visual indications of the layout violation itself for display in the visual canvas 221, such as projection lines, windowed rendering, and textual data. This visualizer 2109 preferably also includes an off-screen violation correction generator 2121, which generates visual indications of a correction scheme for display in the visual canvas 221, such as direction and alignment guides.

Figure 3A:
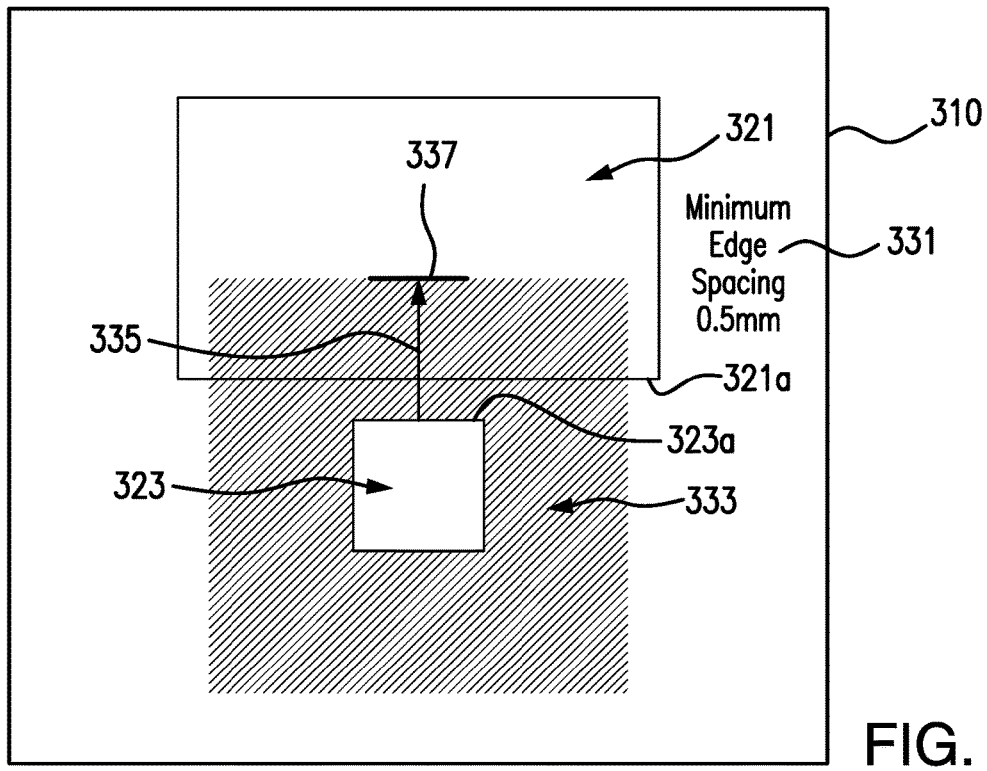
FIGS. 3A and 3B depict example graphic renderings of example electronic circuit designs, in accordance with an exemplary embodiment of the present invention.

FIG. 3A depicts an example graphic rendering of a simple example electronic circuit design, according to one exemplary embodiment of the invention. In the example design, circuit elements 321 and 323 have been arranged and rendered, and the rendering presented in a visual canvas 310.

In the example design, edge 321*a* of circuit element 321 has been moved within the minimum allowable distance of edge 323*a* of circuit element 323, according to one of the predetermined set of circuit layout criteria currently configured for the circuit editor. Circuit elements 321 and 323 therefore form an aberrant arrangement in violation of the circuit layout criteria.

As noted above, in various embodiments, the circuit editor or portions thereof generates visual indications of detected layout violations, of rearrangement schemes or other corrective schemes to correct layout violations, or both. In the example design and embodiment depicted in FIG. 3A, four indicators have been rendered, although alternate embodiments render other combinations of these and other indicators. As depicted, a textual violation indicator 331 indicates the violated criterion, namely the minimum spacing between edges of circuit elements. A zone violation indicator 333 indicates the minimum spacing as applied to circuit element 323, displaying a buffer zone which circuit element 321 has visibly entered. A corrective direction guide indicator 335, here depicted in the form of an arrow, also indicates the minimum spacing through the length of the arrow, and furthermore indicates a direction by which one circuit element or the other may be moved in order to correct the violation. Finally, a graphic alignment guide indicator 337 indicates a corrective placement of circuit element 321, and more specifically of its lower edge 321*a*, such that alignment of the circuit element 321 with the graphic alignment guide indicator 337 would correct the violation. Other indicators, or other specific renderings of the above indicators, may also be conceived by those of skill in the art.

As depicted, indicators 335 and 337 are horizontally centered with circuit element 321, although in alternate embodiments or under other conditions they are instead horizontally centered with circuit element 323. When one or both circuit elements are found to be partially off-screen (such as depicted in FIG. 3D, further herein), indicators 335 and 337 are in certain embodiments horizontally centered with a visible portion of one of the circuit elements. Other placement of the indicators may also be conceived by those of skill in the art.

It is noted that the depicted indicators are presented for example according to how circuit element 321 violates the spacing of circuit element 323. Likewise, the violation correction portion, if any, has formed a presented rearrangement scheme to move circuit element 321, rather than to move circuit element 323. In the depicted embodiment and design, this is due to the circuit element 321 being the most recently placed, repositioned, or otherwise altered circuit element in the aberrant arrangement, and therefore the most likely choice for repositioning or other correction. However, alternate embodiments instead select circuit element 323 as the preferable circuit element to correct, for any rule-based or arbitrary reason.

It is noted that, although the depicted violation occurs between edges that face each other vertically, the same principles are applicable for other orientations; for example, when a right-most edge of one circuit element encroaches on the minimum spacing of the left-most edge of another element. The indicators are preferably reoriented appropriately in such cases.

Figure 3B:
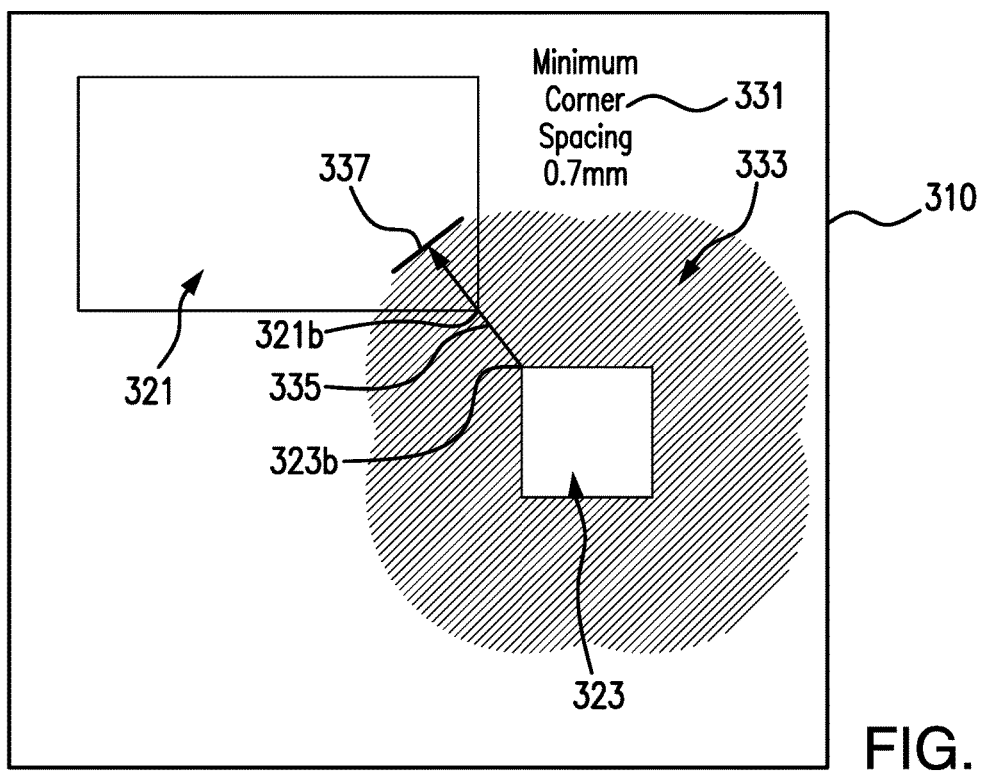

FIG. 3B depicts an example graphic rendering of another simple example electronic circuit design, according to an exemplary embodiment of the invention. In the example design, circuit elements 321 and 323 have been arranged and rendered, and the rendering presented in a visual canvas 310.

In the example design, corner 321*b* of circuit element 321 has been moved within the minimum allowable distance of corner 323*b* of circuit element 323, according to one of the predetermined set of circuit layout criteria currently configured for the circuit editor. Circuit elements 321 and 323 therefore form an aberrant arrangement in violation of the circuit layout criteria.

Like visual indicators are still applicable to this arrangement as in FIG. 3A, with minor alteration. As before, a textual violation indicator 331 indicates the violated criterion, in this case the minimum corner spacing. The zone violation indicator 333 indicates the minimum spacing from each corner as applied to circuit element 323, resulting in a differently-shaped buffer zone. (In certain embodiments, the system merges the edge spacing and corner spacing zone violation indicators, to visually present a complete buffer zone for both criteria, regardless of which criterion is currently violated.) The corrective direction guide indicator 335 is angled to contact both corners 321*b* and 323*b*, and indicates both the minimum spacing and a direction to move circuit element 321; in this embodiment, the direction is determined according to the line formed between corners 321*b* and 323*b*. Finally, the graphic alignment guide indicator 337 indicates a corrective placement of corner 321*b* of circuit element 321. It is noted that graphic alignment guide indicator 337 remains shaped like a flat line in this embodiment, but in alternate embodiments is shaped substantially like a corner or dot; any other form suitable to visually aligning with a correctly placed lower-right corner 321*b* of circuit element 321 will also suffice. Likewise, in various embodiments, the other indicators have other specific renderings, and still more indicators may also be conceived by those of skill in the art, as in FIG. 3A.

Other indicators may be conceived by those of skill in the art for other forms of violations, and will not be elaborated upon herein.

It is noted that, in various embodiments and design arrangements, substantially the same arrangements of indicators are used, without noticeable alteration, when circuit element 323 is partially outside the visual canvas 310. However, the zone violation indicator 333 will not be completely visible in such instances, and therefore, in various embodiments and design arrangements, the zone violation indicator 333 will not be rendered, will be rendered normally but partially outside the visual canvas 310, or will be altered in other ways that will be clear to those of skill in the art.

However, in certain circumstances where circuit element 323 is partially or completely outside the visual canvas 310, further alteration of the indicators is preferable. Some of these circumstances will be described below.

Figure 3C:
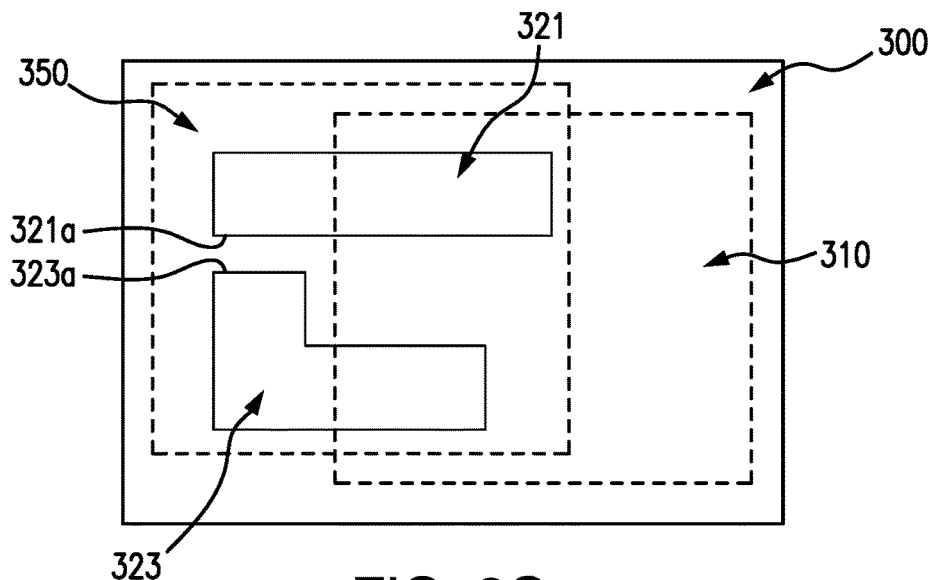
FIG. 3C depicts an example graphic rendering of a simple example electronic circuit design.
Figure 3D:
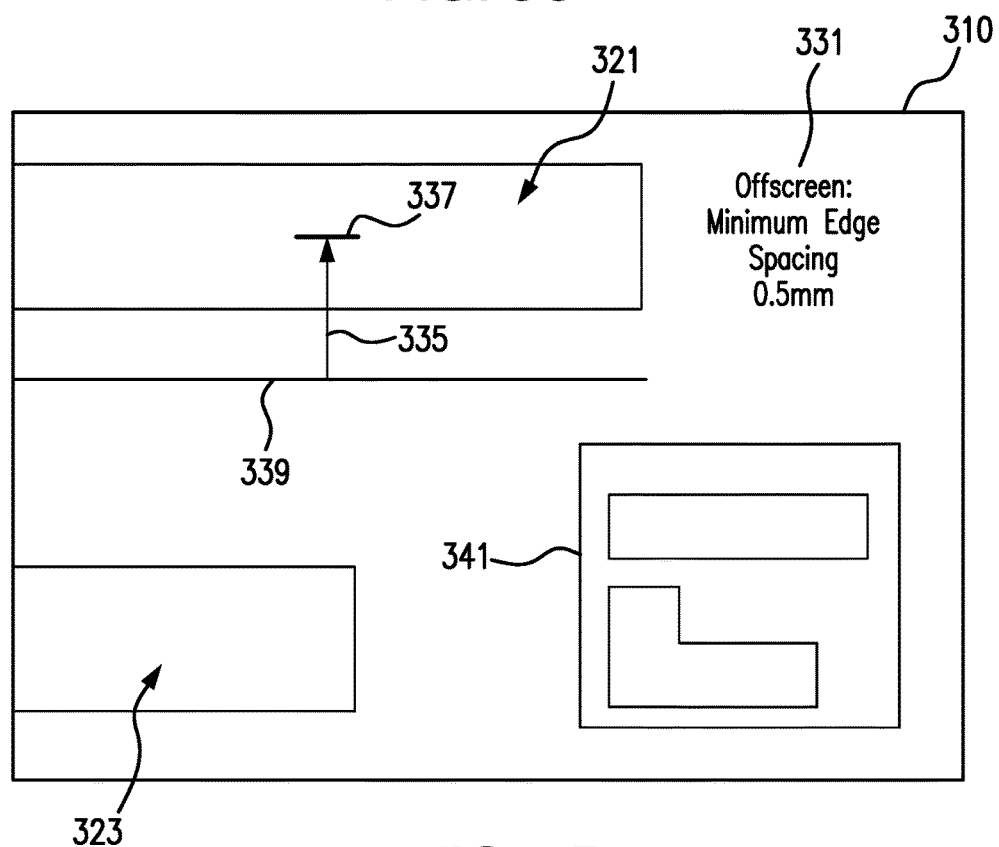
FIG. 3D depicts an on-screen portion of the example electronic circuit design of FIG. 3C with violation indicators, in accordance with an exemplary embodiment of the present invention.

FIG. 3C depicts an example graphic rendering of a simple example electronic circuit design, and FIG. 3D depicts an on-screen portion of the example electronic circuit design with violation indicators, according to an embodiment of the invention. In the example design, circuit elements 321 and 323 have been arranged and rendered in a graphic rendering 300, and the rendering presented in a visual canvas 310.

Again, in the example design, edge 321a of circuit element 321 has been moved within the minimum allowable distance of edge 323a of circuit element 323, according to one of the predetermined set of circuit layout criteria currently configured for the circuit editor. Circuit elements 321 and 323 therefore form an aberrant arrangement in violation of the circuit layout criteria. However, edge 323a is outside the visual canvas 310. Said edge, and therefore the aberrant arrangement causing the violation of the circuit layout criteria, are in an undisplayed, off-screen portion of the electronic circuit design. To a user, who can see only the contents of the visual canvas 310, it appears that circuit elements 321 and 323 are sufficiently far apart to be consistent with the circuit layout criteria, and many of the indicators 331, 333, 335, and 337, if rendered as shown in FIG. 3A, will either also be off-screen or be confusing rather than helpful.

Therefore, as depicted in FIG. 3D, a projection line indicator 339 is preferably rendered. The projection line indicator 339 in the illustrated example extends from the off-screen edge 323a of circuit element 323 into the visual canvas, to more accurately indicate the edge's placement relative to edge 321a of circuit element 321. Other indicators such as textual violation indicator 331, corrective direction guide indicator 335, and graphic alignment guide indicator 337 are helpful when placed relative to the projection line indicator 339, which is within the visual canvas 310 and therefore visible to a user, as opposed to the edge 323a, which is not. The projection line indicator 339 is preferably rendered to extend from at least the edge of the visual canvas 310 to at least the location of any indicator which would contact edge 323a were it on-screen, such as corrective direction guide indicator 335. As depicted, the projection line indicator 339 is rendered to extend from the edge of the visual canvas 310 to the far-right edge of circuit element 321. In certain embodiments, the textual violation indicator 331 is also present and provides the added information that the violation is off-screen.

Finally, a windowed layout indicator 341 may be rendered, which depicts an aberrant portion 350 of the electronic circuit design containing all of the aberrant arrangement of circuit elements. In certain embodiments, the aberrant portion 350 is equivalent to the entire design, but as depicted in FIGS. 3C and 3D, is a smaller portion more immediately surrounding all circuit elements 321, 323 in the aberrant arrangement. The windowed layout indicator 341 provides further visual context to the designer as to the nature of the violation.

However, the windowed layout indicator 341 will in certain design arrangements cover other information in the visual canvas 310 due to its size. Therefore, the windowed layout indicator 341 is preferably added to or removed from the visual canvas 310 responsive to user input, such as a keystroke, keystroke combination, or other user input mechanisms known in the art.

For ease of depiction, the windowed layout indicator 341 and aberrant portion 350 will be omitted from the descriptions of other example electronic circuit designs or violations below. Likewise, the textual violation indicator 331 will also be omitted. However, it is noted that, in certain embodiments, the textual violation indicator 331 and windowed layout indicator 341 are provided responsive to other violations such as those depicted below.

It is noted that the same arrangements of indicators is usable, without noticeable alteration, when circuit element 323 is completely outside the visual canvas 310.

Figure 3E:
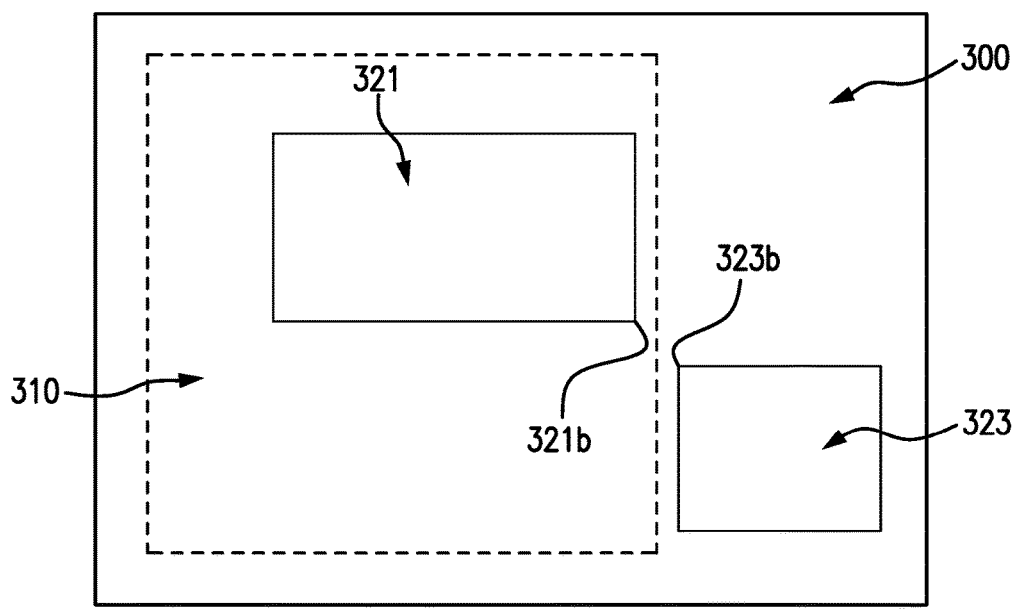
FIG. 3E depicts an example graphic rendering of another simple example electronic circuit design.
Figures 1, 2, 3F:
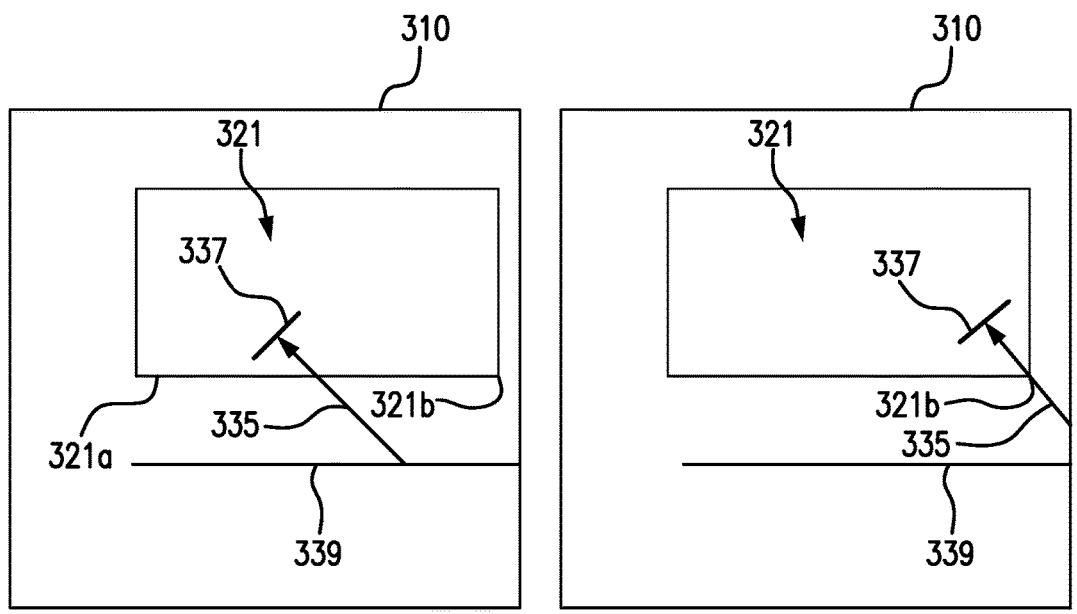
FIGS. 3F-1 and 3F-2 depict an on-screen portion of the example electronic circuit design of FIG. 3E with violation indicators, in accordance with an exemplary embodiment of the present invention.

FIG. 3E depicts an example graphic rendering of another simple example electronic circuit design, and FIGS. 3F-1 and 3F-2 depict an on-screen portion of the example electronic circuit design with violation indicators, according to an embodiment of the invention. In the example design, circuit elements 321 and 323 have been arranged and rendered in a graphic rendering 300, and the rendering presented in a visual canvas 310.

In this example design, corner 321b of circuit element 321 has been moved within the minimum allowable distance of corner 323b of circuit element 323, according to one of the predetermined set of circuit layout criteria currently configured for the circuit editor. Circuit elements 321 and 323 therefore form an aberrant arrangement in violation of the circuit layout criteria. However, corner 323b is outside the visual canvas 310.

Two arrangements of indicators will be considered for this type of violation. In the embodiment depicted in FIG. 3F-1, a projection line indicator 339 is rendered, extending from either edge of circuit element 323 that neighbors corner 323b. (In this arrangement, the upper edge is selected, as a line extending from the left edge would not enter the visual canvas 310 at all.) The corrective direction guide indicator 335 is rendered to extend from the projection line indicator 339. Rather than indicate a corrective placement of corner 321b of circuit element 321, the graphic alignment guide indicator 337 indicates a corrective placement of the center of edge 321a (or, in an undepicted arrangement where circuit element 321 is not fully within the visual canvas, of the center of a visible portion of circuit element 321). The corrective direction guide indicator 335 continues to indicate a preferred direction of movement of circuit element 321, as in FIG. 3B, which is preferably the direction of a line between the two corners. The textual violation indicator 331 appears as before.

In the embodiment depicted in FIG. 3F-2, the corrective direction guide indicator 335 is rendered to extend from the off-screen corner 323b, and to indicate a preferred direction of movement of circuit element 321, which is preferably the direction of a line between the two corners. The graphic alignment guide indicator 337 indicates a corrective placement of corner 321b of circuit element 321. The projection line indicator 339 is rendered to further indicate the position of circuit element 323 in FIG. 3F-2, although in certain embodiments otherwise using this arrangement of indicators, the projection line indicator 339 is omitted. The textual violation indicator 331 appears as before.

Figure 3G:
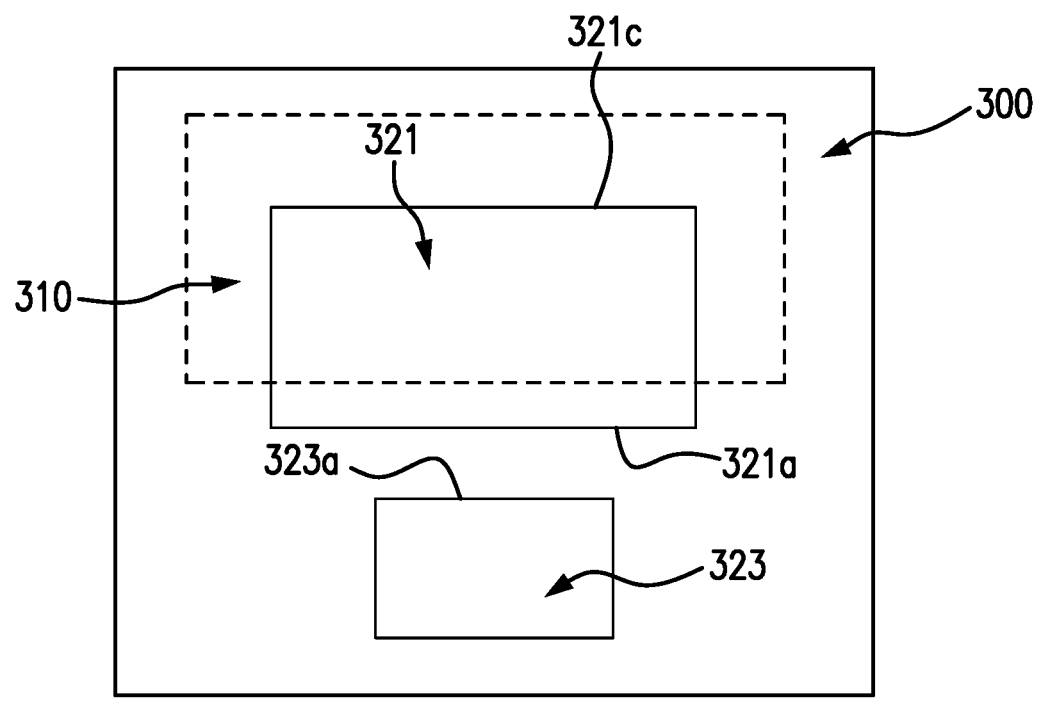
FIG. 3G depicts an example graphic rendering of another simple example electronic circuit design.
Figure 3H:
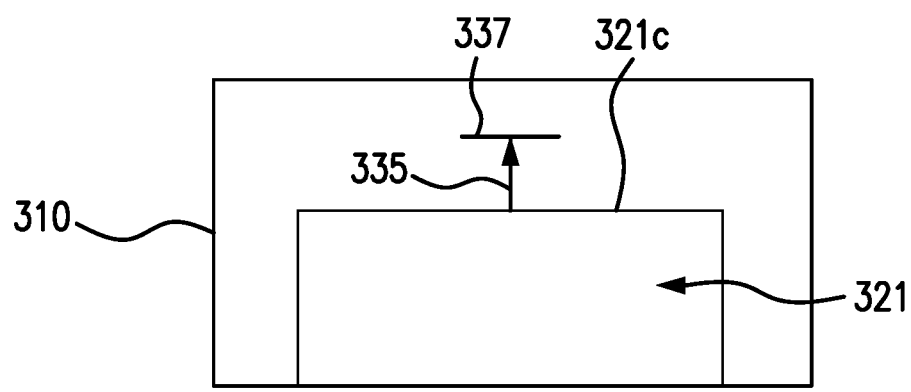
FIG. 3H depicts an on-screen portion of the example electronic circuit design of FIG. 3G with violation indicators, in accordance with an exemplary embodiment of the present invention.

FIG. 3G depicts an example graphic rendering of still another simple example electronic circuit design, and FIG. 3H depicts an on-screen portion of the example electronic circuit design with violation indicators, according to an exemplary embodiment of the invention. In the example design, circuit elements 321 and 323 have been arranged and rendered in a graphic rendering 300, and the rendering presented in a visual canvas 310.

In this example design, lower edge 321*a* of circuit element 321 has been moved within the minimum allowable distance of edge 323*a* of circuit element 323, according to one of the predetermined set of circuit layout criteria currently configured for the circuit editor. However, both circuit element 323 and lower edge 321*a* of circuit element 321 are completely outside the visual canvas 310. Additionally, any projection line indicator 339 based on edge 323*a* of circuit element 323 would not enter the visual canvas 310 either.

Therefore, in the depicted embodiment, corrective direction guide indicator 335 is now rendered extending not from a projection line indicator but from upper edge 321*c* of circuit element 321; that is, the edge opposite lower edge 321*a* of circuit element 321 which is causing the violation. The corrective direction guide indicator 335 still indicates the direction of corrective movement for circuit element 321. Graphic alignment guide indicator 337 is rendered to indicate a corrective placement of upper edge 321*c* of circuit element 321, rather than of lower edge 321*a*. A projection line indicator is not present. However, a user can still understand the nature of the violation and a correction scheme which will resolve the violation.

Figure 3I:
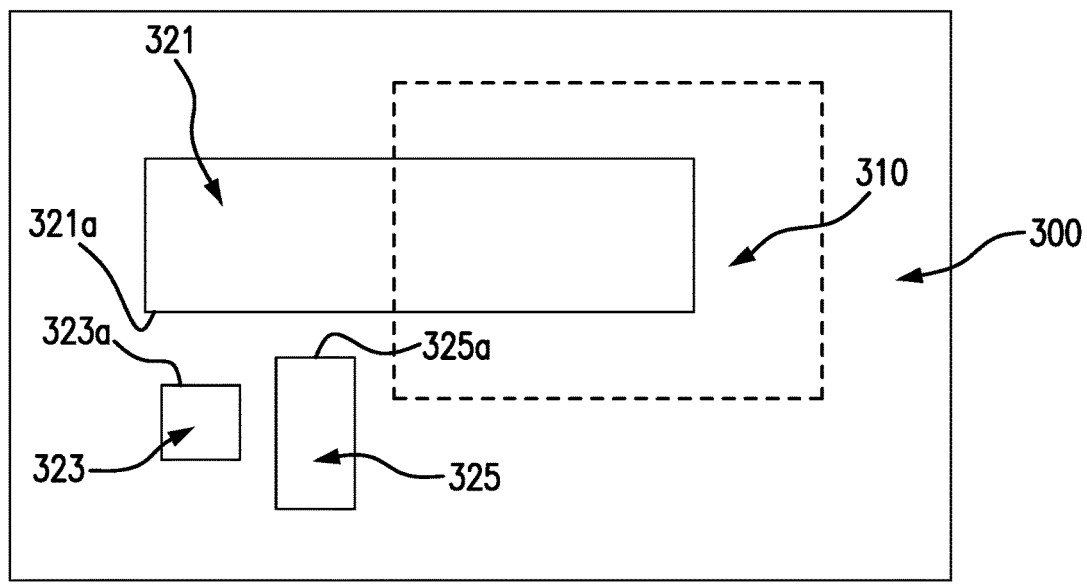
FIG. 3I depicts an example graphic rendering of another simple example electronic circuit design.
Figure 3J:
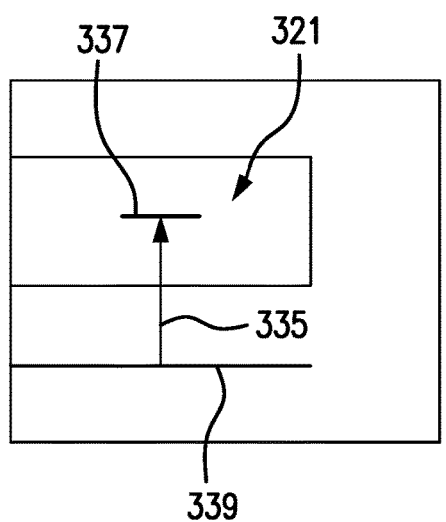
FIG. 3J depicts an on-screen portion of the example electronic circuit design of FIG. 3I with violation indicators, in accordance with an exemplary embodiment of the present invention.

FIG. 3I depicts an example graphic rendering of yet another simple example electronic circuit design, and FIG. 3J depicts an on-screen portion of the example electronic circuit design with violation indicators, according to an exemplary embodiment of the invention. In the example design, circuit elements 321, 323, and 325 have been arranged and rendered in a graphic rendering 300, and the rendering presented in a visual canvas 310.

In this example design, both of circuit elements 323 and 325 are disposed completely outside the visual canvas 310. Additionally, edge 321*a* of circuit element 321 has been moved within the minimum allowable distance of edge 323*a* of circuit element 323, and also within the minimum allowable distance of edge 325*a* of circuit element 325, according to one of the predetermined set of circuit layout criteria currently configured for the circuit editor. Therefore, the depicted aberrant arrangement includes two separate violations.

In certain embodiments and configurations, indicators are generated for both violations, each as previously depicted in FIG. 3D. However, this can result in a large number of indicators which may crowd the visual canvas 310 in a confusing manner. Therefore, in the depicted embodiment and configuration, a "severest" violation related to a given circuit element is selected, and indicators 335, 337, and 339 are generated based solely on the severest violation.

The "severest" violation is selected such that correction of the severest violation will correct all other violations as well, removing the need to alert a user to the other violations. In various arrangements, including the depicted arrangement, the severest violation for a spacing criterion is determined according to a maximum spacing violation: for instance, if circuit element 321 is determined to violate the minimum spacing of circuit element 323 by 0.2 mm, but the minimum spacing of circuit element 325 by 0.4 mm, the violation of circuit element 325 is the severest violation.

However, when violations are of a different nature from each other (e.g. both spacing and non-spacing violations), it is likely that there is no common value by which the violations can be compared, and therefore neither is a severest violation over the other. Therefore, in such instances, it is preferable to form corrective schemes and render indicators for both violations.

Also, the system preferably confirms that the selected rearrangement or other corrective scheme will correct all violations, and if not, neither is a severest violation over the other. For example, if a first circuit element violates the spacing of a horizontal edge of a second circuit element, and violates the spacing of a vertical edge of a third circuit element, the simplest corrective scheme for the violation of the second circuit element (moving the first circuit element some distance vertically) will not resolve the violation of the third circuit element, and the simplest corrective scheme for the violation of the third circuit element (moving the first circuit element some distance horizontally) will not resolve the violation of the second circuit element. Therefore, in such instances, it is preferable to form corrective schemes and render indicators for both violations.

Figure 4:
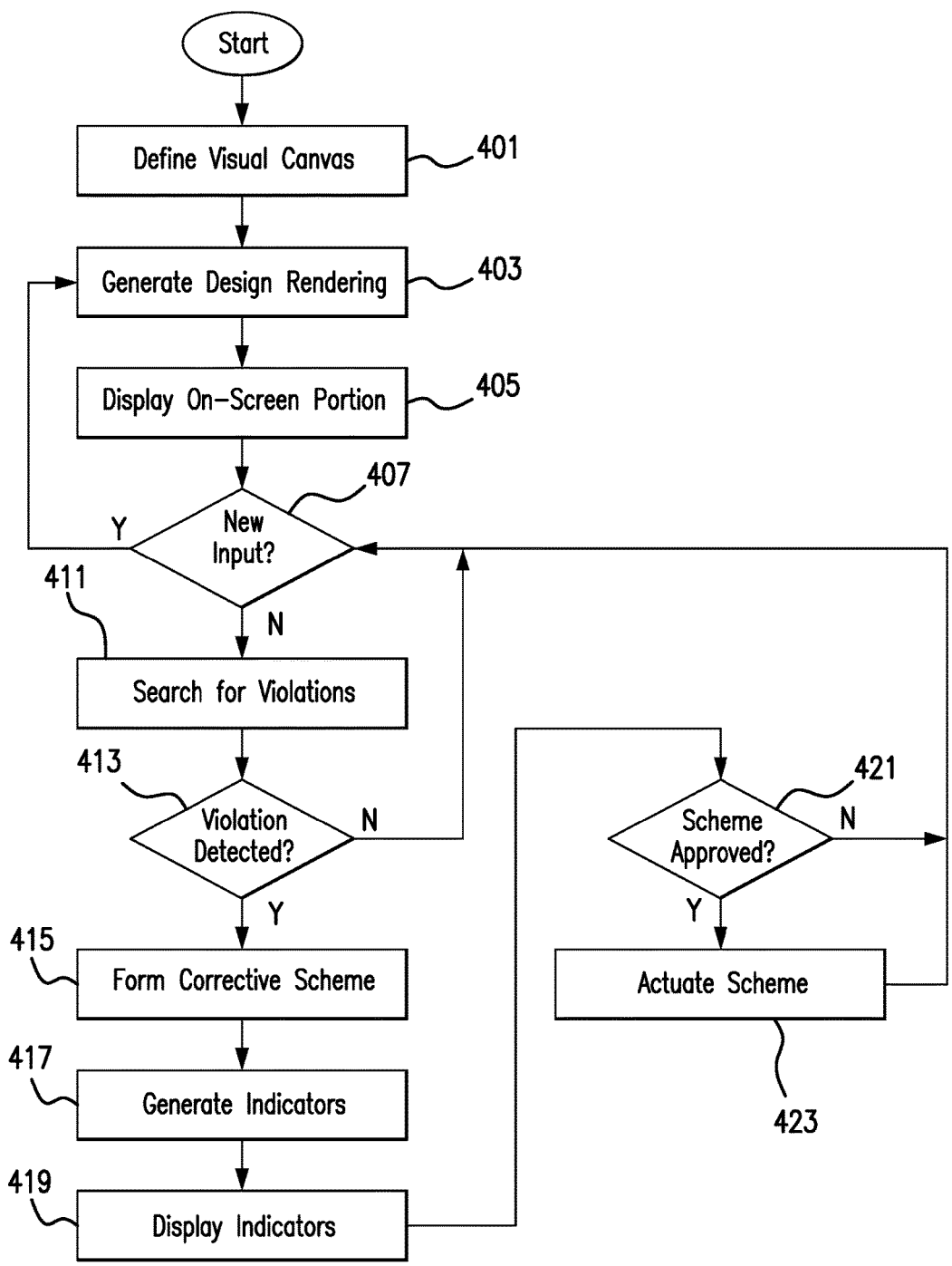
FIG. 4 is a block flowchart illustrating a method of viewing and editing an electronic circuit design, in accordance with an exemplary embodiment of the present invention.

FIG. 4 illustrates a method of viewing and editing an electronic circuit design, in accordance with an exemplary embodiment of the present invention. At 401, a visual canvas is defined on a display unit. At 403, a graphic rendering of an electronic circuit design is generated. In certain embodiments, the rendering is generated through a graphical processor or other processor. At 405, a first, on-screen portion of this graphic rendering is displayed within the visual canvas by the display unit, while a second, off-screen portion is not. If, at 407, user input is forthcoming through a user interface, the process returns to 403 to generate a new graphic rendering responsive to the input. Otherwise, the process proceeds to 411.

At 411, the electronic circuit design is searched for violations of (that is, inconsistencies with) a predetermined set of circuit layout criteria. This search is preferably performed by executing the violation detection portion described above on a processor. If no violation is detected in the search, at 413, the process returns to 407 for more user input. Otherwise, the process proceeds to 415. At 415, a corrective scheme for a detected violation, such as a rearrangement scheme of circuit elements, is formed. This formation is preferably performed by executing the violation correction portion described above on a processor. At 417, indication renderings for the detected layout violation and the corresponding corrective scheme are generated. Numerous, non-limiting indicators have been described above; in various embodiments, various combinations of these and other indicators are included in the indication renderings. These renderings are then displayed with the on-screen portion of the graphic rendering of the design at 419.

In certain embodiments, at 421, rather than directly manipulate the circuit elements in accordance with the indicated corrective scheme, a user can simply approve the indicated corrective scheme through a user input. If this approval input is provided, the scheme is actuated at 423, correcting the detected violation. If the approval input is not provided, the process merely returns to 407 to consider other user input.

These and related processes, and other necessary instructions, are preferably encoded as executable instructions on one or more non-transitory computer readable media, such as hard disc drives or optical discs, and executed using one or more computer processors, in concert with an operating system or other suitable measures.

In a software implementation, the software includes a plurality of computer executable instructions, to be implemented on a computer system. Prior to loading in a computer system, the software preferably resides as encoded information on a suitable non-transitory computer-readable tangible medium, such as a magnetic floppy disk, a magnetic tape, CD-ROM, or DVD-ROM.

In certain implementations, the invention includes a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) are in certain embodiments also developed to perform these functions.

Figure 5:
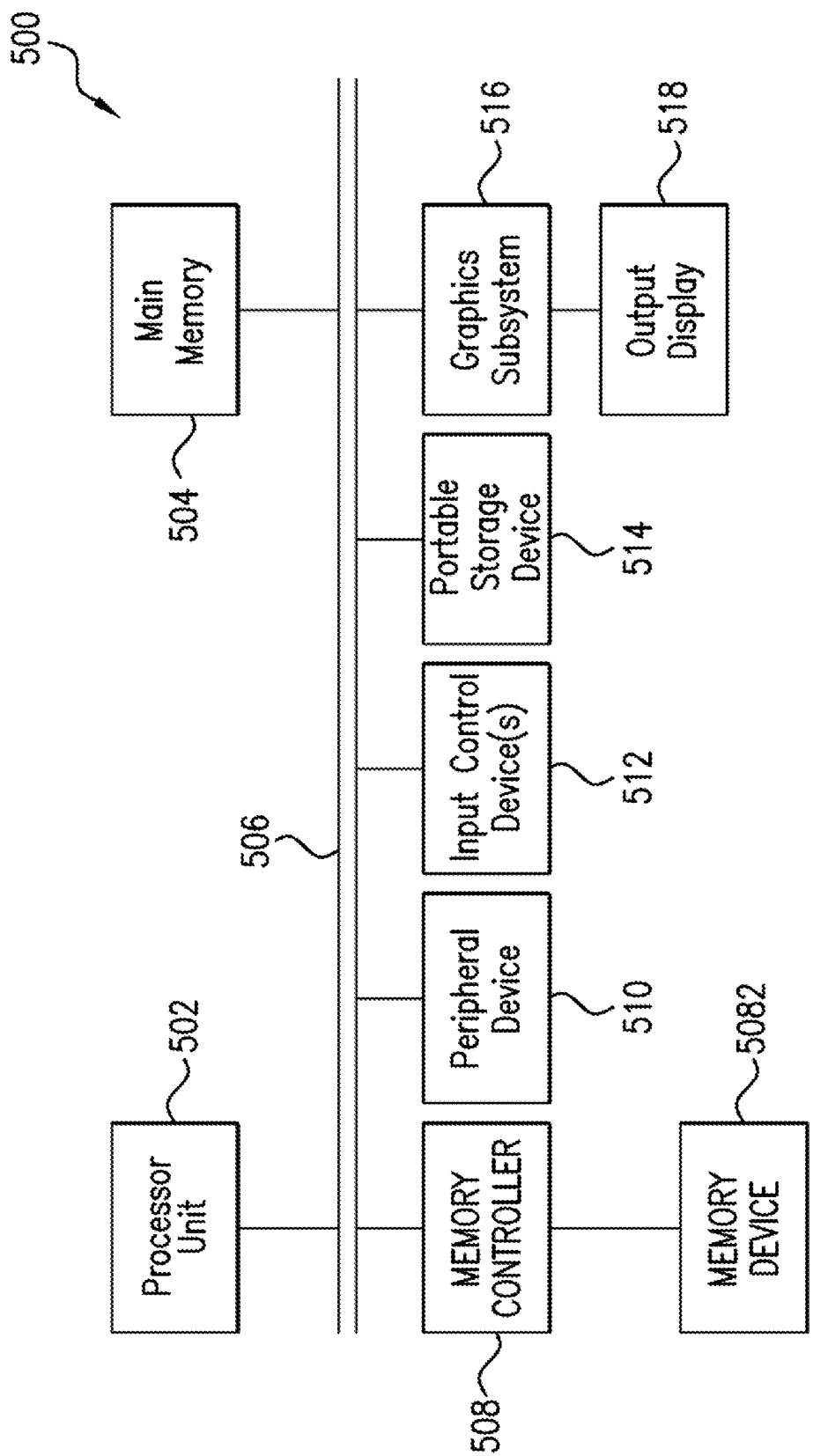
FIG. 5 is a block diagram illustrating an exemplary computer system for programmatic and/or hardware implementation of various embodiments and aspects of the present invention.

As an example, FIG. 5 is a block diagram illustrating an exemplary computer system for programmatic and/or hardware implementation of various aspects of the disclosed system and method. For instance, it may serve as a host for such hardware modules, and/or as a host for executing software modules such as electronic design automation (EDA) tools/simulations/emulation/firmware, in accordance with various configurations of the disclosed system and method.

According to certain embodiments, computer system 500 includes a processor unit 502, a main memory 504, an interconnect bus 506, a memory controller 508 that is coupled to a memory device 5082, peripheral device(s) 510, input control device(s) 512, portable storage medium drive (s) 514, a graphics subsystem 516, and an output display unit 518. In various embodiments, processor unit 502 includes a single microprocessor or a plurality of microprocessors for configuring computer system 500 as a multi-processor system. Main memory 504 stores, in part, instructions and data to be executed by processor unit 502. Main memory 504 preferably includes banks of dynamic random access memory (DRAM) as well as high-speed cache memory.

For the purpose of simplicity, the components of computer system 500 are depicted to be interconnected via interconnect bus 506. However, in alternate embodiments, computer system 500 is interconnected through one or more data transport means. For example, in certain embodiments, processor unit 502 and main memory 504 are interconnected via a local microprocessor bus; and memory controller 508, peripheral device(s) 510, portable storage medium drive(s) 514, and graphics subsystem 516 are interconnected via one or more input/output (I/O) buses. Memory device 5082 is preferably implemented as a nonvolatile semiconductor memory for storing data and instructions to be used by processor unit 502. Memory device 5082 preferably stores the software to load it to the main memory 504, but in alternate embodiments is represented in an EDA tool simulation by suitable classes (incorporating data structures and functions operable upon the data structures) or the like as would be known to one of skill in the art.

Portable storage medium drive 514 operates to input and output data and code to and from the computer system 500. In one configuration, the software is stored on such a portable medium, and is input to computer system 500 via portable storage medium drive 514. In various embodiments, peripheral device(s) 510 includes any type of computer support device such as an input/output (I/O) interface, to add additional functionality to computer system 500. For example, in certain embodiments, peripheral device(s) 510 includes a network interface card, to interface computer system 500 to a network. In certain embodiments, peripheral device(s) also includes a memory controller and nonvolatile memory.

Input control device(s) 512 provide a portion of the user interface for a computer system 500 user. In various embodiments, input control device(s) 512 includes an alphanumeric keypad for inputting alphanumeric and other key information; and a cursor control device such as a mouse, a trackpad or stylus; or cursor direction keys.

In order to display textual and graphical information, computer system 500 includes graphics subsystem 514 and output display unit(s) 518. In various embodiments, output display unit 518 includes a cathode ray tube (CRT) display, liquid crystal display (LCD), plasma, or active matrix organic light emitting diode (AMOLED) display, or other device suitable for visual presentation. Graphics subsystem 516 receives textual and graphical information, and processes the information for output to display unit 518.

The descriptions above are intended to illustrate possible implementations of the disclosed system and method, and are not restrictive. While this disclosure has been made in connection with specific forms and embodiments thereof, it will be appreciated that various modifications other than those discussed above may be resorted to without departing from the spirit or scope of the disclosed system and method. Such variations, modifications, and alternatives will become apparent to the skilled artisan upon a review of the disclosure. For example, functionally equivalent elements or method steps are substitutable for those specifically shown and described, and certain features are usable independently of other features. Additionally, in various embodiments, all or some of the above embodiments are selectively combined with each other, and particular locations of elements or sequence of method steps are reversed or interposed, all without departing from the spirit or scope of the disclosed system and method as defined in the appended claims. The scope should therefore be determined with reference to the description above and the appended claims, along with their full range of equivalents.

What is claimed is:

1. A system for viewing and editing an electronic circuit design, the circuit design having a plurality of circuit elements positioned and interconnected according to a predetermined set of circuit layout criteria, the system comprising:

a circuit editor configured to execute on a processor to generate a graphic rendering of the electronic circuit design responsive to user input through a user interface, the circuit editor including:

a violation detection portion configured to execute to detect a layout violation indicating aberrant arrangement of one or more circuit elements relative to the other circuit elements in a manner inconsistent with the circuit layout criteria, and a violation correction portion configured to execute to resolve a layout violation, said violation correction portion forming a rearrangement scheme for at least one circuit element to restore consistency with the circuit layout criteria; and a display unit coupled to said circuit editor, said display unit configured to define a visual canvas to display the graphic rendering for a first portion of the electronic circuit design, a second portion of the electronic circuit design remaining undisplayed outside the visual canvas;

said circuit editor being configured to generate on the visual canvas, for at least one layout violation having an aberrant arrangement of circuit elements, the at least one layout violation occurring outside the visual canvas, both a first visual indication of the layout violation and a second visual indication of the rearrangement scheme for guiding user correction of the layout violation, the aberrant arrangement of circuit elements involving at least one circuit element having a violation-implicated portion that is undisplayed as being outside the visual canvas, the first and second visual indications being displayed within the visual canvas.

2. The system of claim 1, wherein the first visual indication includes a projection line extending from an edge of a circuit element positioned outside the visual canvas.

3. The system of claim 1, wherein the first visual indication includes the graphic rendering for a third portion of the electronic circuit design containing the aberrant arrangement of circuit elements.

4. The system of claim 1, wherein the second visual indication includes a placement line indicating a graphic alignment guide for a corrective placement of a circuit element in the aberrant arrangement, such that movement of the circuit element to align with the placement line will restore consistency with the circuit layout criteria.

5. The system of claim 1, wherein the second visual indication includes a movement arrow indicating a corrective direction guide for a circuit element in the aberrant arrangement, such that movement of the circuit element in the corrective direction will restore consistency with the circuit layout criteria.

6. The system of claim 1, wherein at least one of the circuit layout criteria defines a minimum distance between neighboring edges of circuit elements.

7. The system of claim 1, wherein at least one of the circuit layout criteria defines a minimum distance between neighboring corners of circuit elements.

8. The system of claim 7, wherein, when the minimum distance between neighboring corners of circuit elements is violated by the aberrant arrangement, a corrective direction of movement for the rearrangement scheme is determined by an angle of a line connecting the neighboring corners.

9. The system of claim 1, wherein, when the violation detection portion detects multiple layout violations, the first visual indication is generated relative to a severest violation.

10. The system of claim 1, wherein the violation correction portion further executes to actuate the defined rearrangement scheme responsive to a user input.

11. A system for viewing and editing an electronic circuit design in accordance with predetermined circuit layout criteria, the system comprising:

a circuit editor configured to execute on a processor to generate and edit a spatially arranged plurality of circuit elements in an electronic circuit design responsive to user input through a user interface, the circuit editor including a violation detection portion configured to execute to detect an arrangement of circuit elements in violation of predetermined circuit layout criteria; and a display unit coupled to said circuit editor, said display unit configured to display a graphic rendering of an on-screen portion of the electronic circuit design, an off-screen portion of the electronic circuit design remaining undisplayed;

wherein the circuit editor is configured to generate for the graphic rendering, based on an arrangement of circuit elements determined to violate the circuit layout criteria including at least one circuit element arranged at least partially in the off-screen portion of the electronic circuit design, both a first visual indication of the violation and a second visual indication of a rearrangement scheme for at least one circuit element to thereby guide user correction of the layout violation, the at least one circuit element arranged at least partially in the off-screen portion being at least partially undisplayed as being outside the visual canvas, the first and second visual indications being displayed within the on-screen portion of the electronic circuit design.

12. A method of viewing and editing an electronic circuit design, the circuit design having a plurality of circuit elements positioned and interconnected according to a predetermined set of circuit layout criteria, the method comprising:

defining a visual canvas on a display unit;

executing a processor to generate a graphic rendering of the electronic circuit design responsive to user input through a user interface;

displaying the graphic rendering for a first portion of the electronic circuit design within the visual canvas of the display unit, a second portion of the electronic circuit design remaining undisplayed outside the visual canvas;

executing a processor to detect a layout violation indicating aberrant arrangement of one or more circuit elements relative to the other circuit elements in a manner inconsistent with the circuit layout criteria, the layout violation involving at least one circuit element that is at least partially undisplayed as being at least partially in the second portion of the electronic circuit design, the aberrant arrangement occurring outside the visual canvas;

executing a processor to form a rearrangement scheme for at least one circuit element to restore consistency with the circuit layout criteria; and executing a processor to generate on the visual canvas for the detected layout violation both a first visual indication of the layout violation and a second visual indication of the rearrangement scheme for guiding user correction of the layout violation, the first and second visual indications being displayed within the first portion of the electronic circuit design.

13. The method of claim 12, wherein the first visual indication includes a projection line extending from an edge of a circuit element positioned outside the visual canvas.

14. The method of claim 12, wherein the first visual indication includes the graphic rendering for a third portion of the electronic circuit design containing the aberrant arrangement of circuit elements.

15. The method of claim 12, wherein the second visual indication includes a placement line indicating a graphic alignment guide for a corrective placement of a circuit element in the aberrant arrangement, such that movement of the circuit element to align with the placement line will restore consistency with the circuit layout criteria.

16. The method of claim 12, wherein the second visual indication includes a movement arrow indicating a corrective direction guide for a circuit element in the aberrant arrangement, such that movement of the circuit element in the corrective direction will restore consistency with the circuit layout criteria.

17. The method of claim 12, wherein at least one of the circuit layout criteria defines a minimum distance between neighboring edges of circuit elements.

18. The method of claim 12, wherein at least one of the circuit layout criteria defines a minimum distance between neighboring comers of circuit elements.

19. The method of claim 12, wherein, when the violation detection portion detects multiple layout violations, the first visual indication is generated relative to a severest violation.

20. The method of claim 12, wherein the violation correction portion further executes to actuate the defined rearrangement scheme responsive to a user input.

* * * * *